(12) United States Patent
Lin et al.

(10) Patent No.: US 10,314,170 B2
(45) Date of Patent: Jun. 4, 2019

(54) MOTHERBOARD OF COMPUTER

(71) Applicant: ASUSTeK COMPUTER INC., Taipei (TW)

(72) Inventors: Bing-Min Lin, Taipei (TW);
Teng-Liang Ng, Taipei (TW);
Ji-Kuang Tan, Taipei (TW);
Ming-Fang Tsai, Taipei (TW);
Chih-Kuang Lin, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 15/813,246

(22) Filed: Nov. 15, 2017

(65) Prior Publication Data

US 2018/0139845 A1 May 17, 2018

(30) Foreign Application Priority Data

Nov. 17, 2016 (CN) .................... 2016 2 1243682 U

(51) Int. Cl.
*H05K 1/18* (2006.01)
*G08B 5/38* (2006.01)
*H05K 1/02* (2006.01)
*H05K 7/20* (2006.01)
*G06F 1/18* (2006.01)
(Continued)

(52) U.S. Cl.
CPC ............ *H05K 1/181* (2013.01); *G06F 1/183* (2013.01); *G06F 1/20* (2013.01); *G06F 11/3058* (2013.01); *G06F 11/325* (2013.01); *G08B 5/38* (2013.01); *H05K 1/0274* (2013.01); *H05K 7/20172* (2013.01); *H05K 1/18* (2013.01); *H05K 2201/09063* (2013.01); *H05K 2201/09145* (2013.01); *H05K 2201/09172* (2013.01); *H05K 2201/10106* (2013.01); *H05K 2201/10151* (2013.01); *H05K 2201/10393* (2013.01);
(Continued)

(58) Field of Classification Search
CPC .. H05K 1/181; H05K 1/0274; H05K 7/20172; H05K 2201/09063; H05K 2201/09172; G08B 5/38
USPC ........................................................ 340/653
See application file for complete search history.

(56) References Cited

U.S. PATENT DOCUMENTS 3,629,787 A * 12/1971 Wilson .................. H01R 12/62
174/88 R
5,575,686 A 11/1996 Noschese
6,418,034 B1 7/2002 Weber et al.
(Continued)

FOREIGN PATENT DOCUMENTS

| WO | 2011/090478 A1 | 7/2011 |
| WO | 2016/122461 A1 | 8/2016 |
| WO | 2016/122594 A1 | 8/2016 |

OTHER PUBLICATIONS

Wes Fenlon:"RGB LEDs are all over motherboards at Computex 2016 /PC Gamer", Jun. 1, 2016(Jun. 1, 2016), XP055459329, Retrieved from the internet:URL: https://www.pcgamer.com/rgb-leds-are-all-over-motherboards-at-computex-2016/.

*Primary Examiner* — John A Tweel, Jr.
(74) *Attorney, Agent, or Firm* — McClure, Qualey & Rodack, LLP

(57) ABSTRACT

A motherboard of a computer is provided. The motherboard of a computer includes a main body, a notch formed at a side edge of the main body, an auxiliary device, and a fixing device formed adjacent to the notch to fix the auxiliary device in the notch, wherein the auxiliary device is a light guiding device including patterns.

9 Claims, 8 Drawing Sheets

(51) Int. Cl.
*G06F 1/20* (2006.01)
*G06F 11/30* (2006.01)
*G06F 11/32* (2006.01)

(52) U.S. Cl.
CPC .............. *H05K 2201/10409* (2013.01); *H05K 2201/10446* (2013.01); *H05K 2201/10522* (2013.01)

(56) References Cited

U.S. PATENT DOCUMENTS

| | | | |
|---|---|---|---|
| 6,585,534 B2 | 7/2003 | Llapitan et al. | |
| 6,990,847 B2* | 1/2006 | Happach | G01K 7/16 374/E7.018 |
| 7,359,012 B2* | 4/2008 | Ishiwa | G02B 6/0091 349/62 |
| 7,439,750 B2* | 10/2008 | Lindorfer | G01N 27/223 324/690 |
| 8,064,199 B2* | 11/2011 | Lin | G06F 1/185 361/679.31 |
| 8,339,263 B2* | 12/2012 | Paananen | G08B 13/14 340/568.1 |
| 9,136,651 B2 | 9/2015 | Xuan et al. | |
| 9,265,175 B2* | 2/2016 | Yoshida | H05K 7/20172 |
| 9,913,401 B2* | 3/2018 | Gonzalez Inda | H05K 7/20172 |
| 2007/0197056 A1 | 8/2007 | Huang et al. | |
| 2009/0154092 A1* | 6/2009 | Chen | G06F 1/187 361/679.51 |
| 2014/0118937 A1* | 5/2014 | Adrian | H05K 7/20172 361/695 |
| 2014/0136859 A1 | 5/2014 | Yang | |
| 2016/0334559 A1 | 11/2016 | Kuo | |

* cited by examiner

MOTHERBOARD OF COMPUTER

CROSS-REFERENCE TO RELATED APPLICATION

This application claims the priority benefit of CN application serial No. 201621243682.X, filed on Nov. 17, 2016. The entirety of the above-mentioned patent application is hereby incorporated by reference herein and made a part of specification.

BACKGROUND OF THE INVENTION

Field of the Invention

The disclosure relates to a motherboard.

Description of the Related Art

In recent years, functions of an electronic device, such as a computer host, a tablet computer, a display, a keyboard, a television box, a phone, becomes diverse. A single electronic device that equipped with all major functions also becomes popular. A printed circuit board (PCB) is a main component of the electronic devices, which provide all the electronic components that configured on the printed circuit board to be electrically connected.

BRIEF SUMMARY OF THE INVENTION

According to a first aspect, a motherboard is provided. The motherboard comprises a main body, a notch formed at a side edge of the main body, and a fixing device formed adjacent to the notch to fix an auxiliary device.

The motherboard includes a notch. The auxiliary device is installed in the notch effectively, and the airflow is guided to other surfaces of the motherboard. The aesthetic perception of the circuit board is improved via the light-emitting component and the guiding device. A default pattern is displayed simultaneously. Furthermore, the function of the notch can be expanded. As a result, the function of the motherboard is expanded significantly while artistic of the appearance of the motherboard is improved.

BRIEF DESCRIPTION OF THE DRAWINGS

These and other features, aspects and advantages of the disclosure will become better understood with regard to the following embodiments and accompanying drawings.

DETAILED DESCRIPTION OF THE EMBODIMENTS

These and other features, aspects, and advantages of the disclosure will become better understood with regard to the following description, appended claims, and accompanying drawings. However, the embodiments are not limited herein. The description of the operation of components is not used for limiting the execution sequence. Any equivalent device with the combination according to the disclosure is in the scope of the disclosure. The components shown in figures are not used to limit the size or the proportion. The same or similar numbers denote the same or similar components or steps.

Unless specifically noted, terms used in the whole specification and the claims have common meanings in the art, in the disclosure, or in the special content. Some words used to describe the present disclosure will be discussed below or elsewhere in the specification, so as to provide additional guidance to those skilled in the art on the description of the present disclosure.

"The first", "the second" and so on are not used to limit the order or the disclosure. They are only used to distinguish components or operations with same technical terms.

The terms "comprising", "including", "having", and so on, are open-ended.

Figure 1:
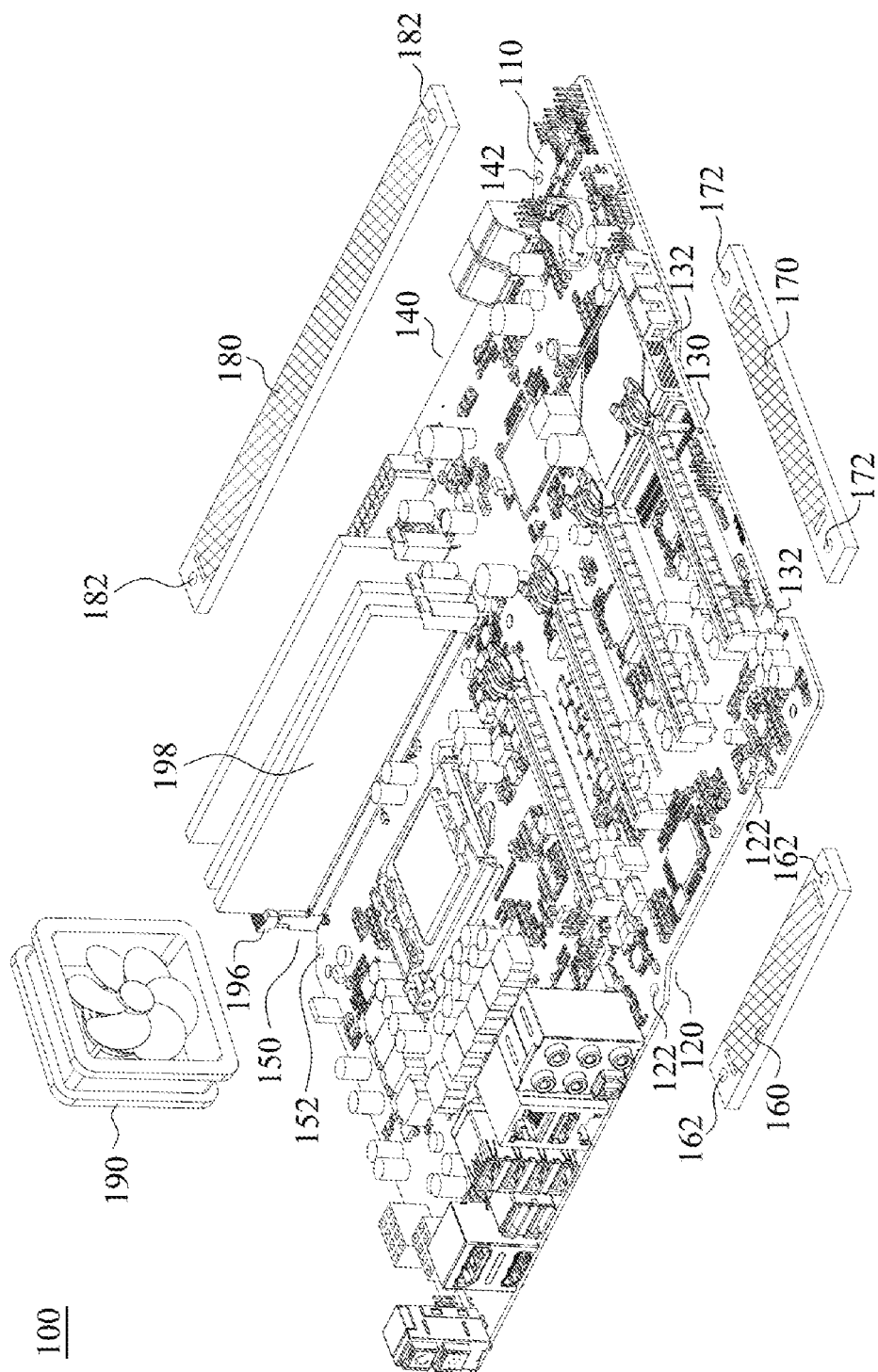
FIG. 1 is a schematic diagram showing a motherboard in an embodiment.
Figure 2:
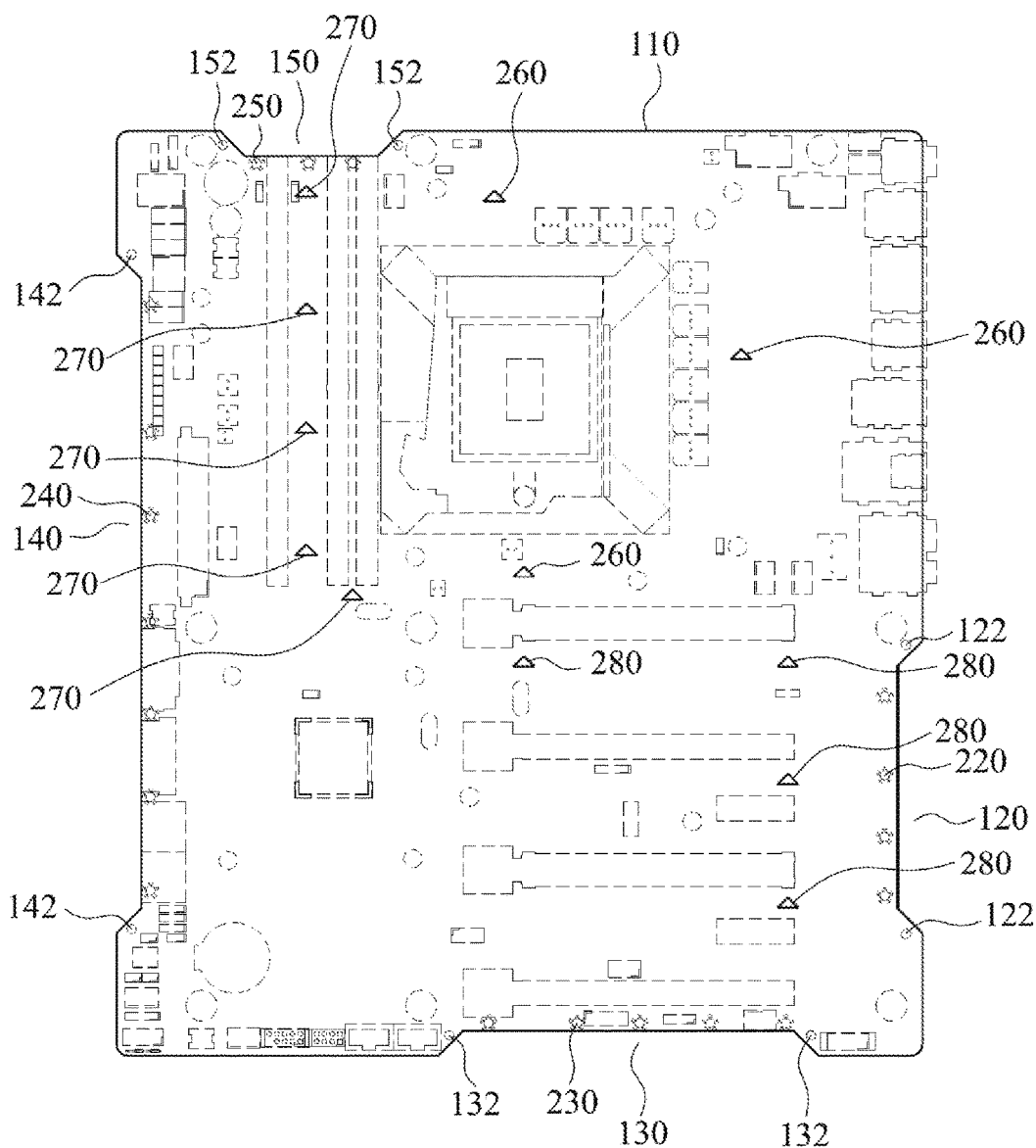
FIG. 2 is a schematic diagram showing a back of a motherboard in FIG. 1.

FIG. 1 is a schematic diagram showing a motherboard in an embodiment. FIG. 2 is a schematic diagram showing a back of a motherboard in FIG. 1. As shown in FIG. 1 and FIG. 2, in an embodiment, a motherboard 100 includes a main body 110. A notch 120 is formed at a side edge of the main body 110. Fixing devices 122 are formed adjacent to the notch 120. In the embodiment, the fixing devices 122 are fixed on two sides of the notch 120.

The fixing device 122 is configured to fix an auxiliary device 160. The auxiliary device 160 is a light guiding device, a light uniforming component, a cable clip, or a fan, which is not limited herein.

In an embodiment, notches 130, 140 and 150 are formed at the other side edges of the main body 110. The fixing devices 132 are formed on the two sides of the notch 130. The fixing devices 142 are formed on the two sides of the notch 140. The fixing devices 152 are formed on the two sides of the notch 150. The auxiliary devices 170, 180 and 190 are installed in the notches 130, 140 and 150, respectively.

The fixing devices 122, 132, 142, and 152 are structures configured for fixing the auxiliary devices 160, 170, 180, 190. In an embodiment, the fixing devices 122, 132, 142, and 152 are through holes, threaded holes, planes, or tenons.

As shown in FIG. 1, in an embodiment, the auxiliary devices 160, 170 and 180 are light guiding devices or light uniforming components, which is not limited herein. In an embodiment, the auxiliary device 190 is a fan. The fan is installed in the notch 150 adjacent to a memory slot 196 of the main body 110 to cool a memory card 198.

In an embodiment, the memory card 198 is a Double Data Rate Synchronous Dynamic Random Access Memory (DDR SDRAM), such as DDR SDRAM, DDR2 SDRAM, DDR3 SDRAM or DDR4 SDRAM.

Since a fan is installed in the notch 150 adjacent to the memory slot 196, airflow passes through a gap between the memory slots 196 via the fan. Then, heat from memory cards 198 is dissipated out. In an embodiment, airflow is blown to the upper and lower surface of the main body 110, and then heat from the upper and lower surface of the main body 110 is taken out. In an embodiment, airflow is brought into both the gap between the memory slots 196, and the upper and lower surface of the main body 110 at the same time via the fan, and then the memory card 198 and the main body 110 are cooled.

In an embodiment, the notches 120, 130, 140 or 150 of the main body 110 are air guiding notches. The airflow is guided to the other surface of the main body 110 via the air guiding notch. The heat dissipation effect of the other surface of the main body 110 is improved.

In an embodiment, two combining components 162 are configured at two sides of the auxiliary device 160. The combining components 162 are configured to be combined with the fixing device 122 of the notch 120. Then, the auxiliary device 160 is fixed to the main body 110.

In an embodiment, the combining component 162 is a dual adhesive tape, a screw or a tenon, which is not limited herein. Similarly, two combining components 172 are configured at two sides of the auxiliary device 170. Two combining components 182 are configured at two sides of the auxiliary device 180.

As shown in FIG. 2, a plurality of light-emitting components 220, 230, 240, 250 are disposed on a back surface of the main body 110 of the motherboard 100. The light-emitting components 220, 230, 240, 250 are configured around the notches 120,130,140 and 150 of the main body 110, respectively. The light-emitting components 220, 230, 240, 250 generate light with color changes.

A plurality of detecting units 260, 270 and 280 are configured at the back surface of the main body 110. In an embodiment, the detecting units 260, 270 and 280 are temperature detecting units or short circuit detecting units to detect the temperature or moisture near the area of the central processor, the dynamic random-access memory and the Peripheral Component Interconnect Express (PCI-E).

In an embodiment, liquid nitrogen is used to overclock the motherboard. Frost may be generated or water is accumulated when the main body 101 is in a low temperature condition for a long time. The detecting units 260, 270, and 280 are configured to detect the temperature or water under a central processor or a computer slot, such as a memory slot, a Peripheral Component Interconnect (PCI) slot, a Peripheral Component Interconnect Express (PCI-E) slot. The light-emitting component is used to remind users the operation state of the motherboard timely. The light condition is various according to the detecting result of the detecting units. Then, the problem can be solved accordingly in time to avoid damage of the motherboard.

In an embodiment, the light conditions include light of a specific color and a flashing light. In an embodiment, part of the light-emitting component is on while the others are off to show different light conditions, which is not limited herein.

Figure 6:
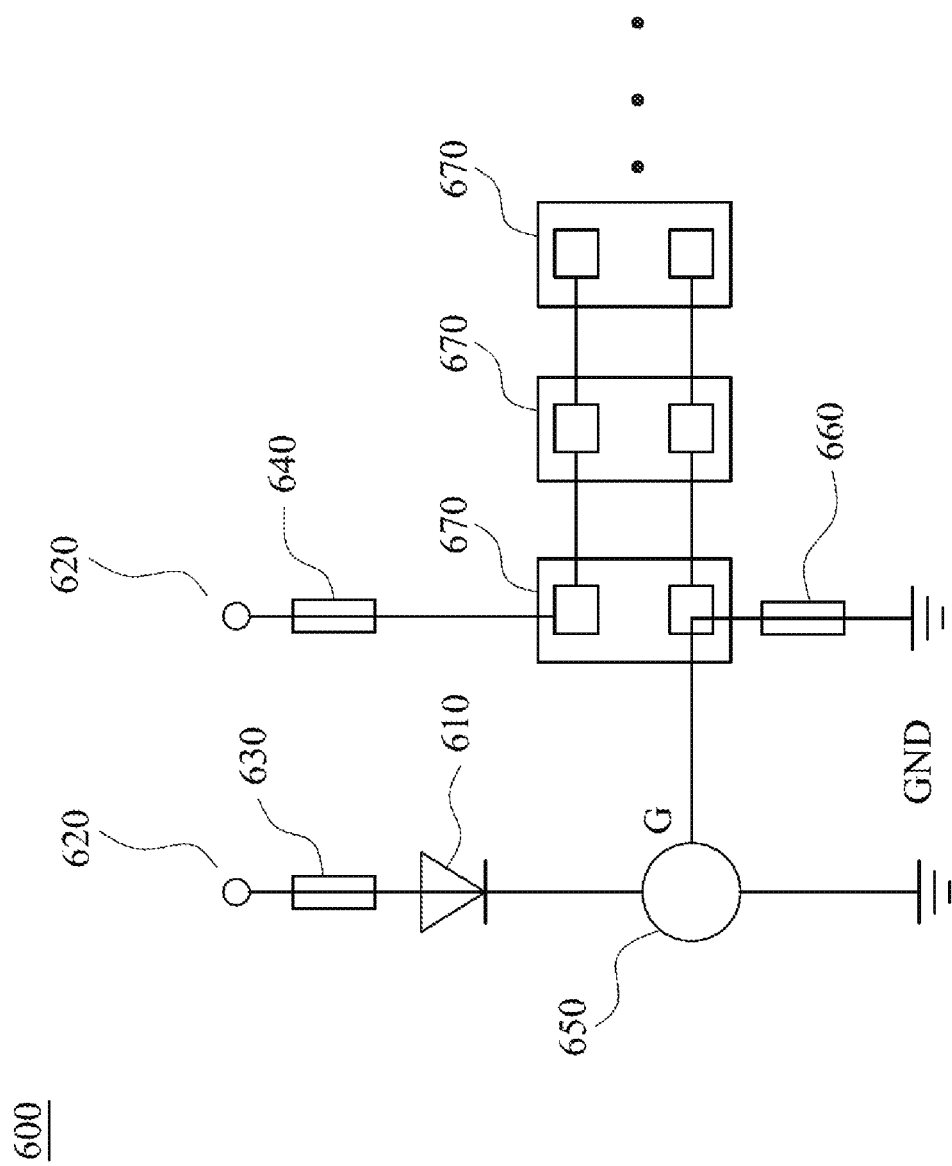
FIG. 6 is a schematic diagram showing a water sensor circuit of a motherboard in an embodiment.

Please refer to FIG. 6, the detecting unit 600 is configured to detect the operation status of the motherboard 100. In an embodiment, the detecting unit 600 includes a light emitting diode 610, a power supply 620, a first resistor 630, a second resistor 640, a transistor 650, a third resistor 660 and sensing components 670. The sensing components 670 are configured to detect the water accumulation. When any one of the sensing components 670 is short due to the effect of the water accumulation, a gate G of the transistor 650 is in a high potential via the power supply 620, the second resistor 640, and the third resistor 660, and the transistor 650 is conducted. Then, the light emitting diode 610 emits light to notice users that water is accumulated at the bottom of the motherboard 100.

In an embodiment, the water accumulation position and operation status of the motherboard 100 are obtained according to the location and color of the light emitting diode 610. For example, the water accumulation position of the computer component is obtained according to the position of the light emitting diode 610. The operation status is determined according to the color of the light emitting diodes 610 or whether the light emitting diode 610 is on.

Figure 7:
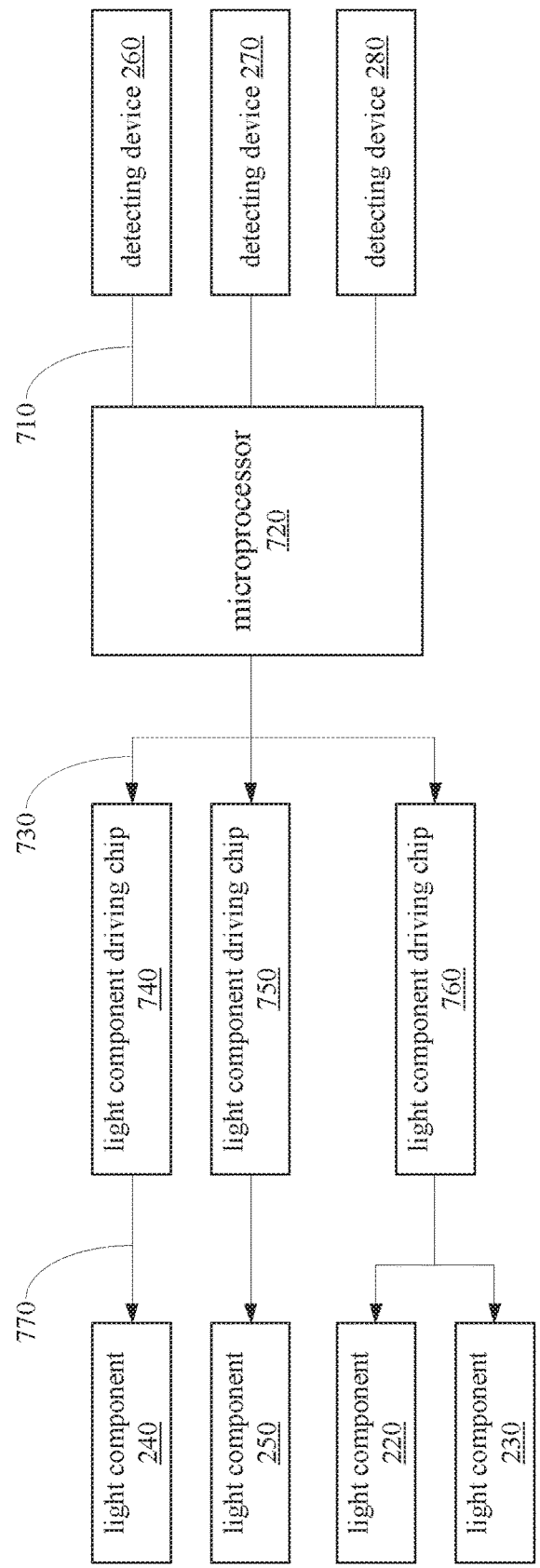
FIG. 7 is a schematic diagram showing a temperature detection and display circuit of a motherboard in an embodiment.

Please refer to FIG. 7. FIG. 7 is a schematic diagram showing a temperature detection and display circuit of a motherboard in an embodiment. In the embodiment, the detecting units 260, 270 and 280 are temperature detectors. The temperature values detected by temperature detectors are obtained via a microprocessor 720 disposed on the main body 110 of the motherboard 100 and a circuit 710. Light-emitting component driving chips 740, 750 and 760 are controlled via the circuit 730, respectively. The colors of the light-emitting components 240, 250, 220 and 230 are controlled by the circuit 770.

When the auxiliary devices 160, 170 and 180 are light guiding devices or light uniforming components, predetermined colors and patterns are displayed on the surface of the auxiliary devices 160, 170 and 180. In an embodiment, the auxiliary device 190 is a fan. The fan includes a light guiding casing. The colorful light of the light-emitting component 250 are guided to the casing of the fan. Then, color changes are shown at the casing of the fan.

In an embodiment, the light-emitting components 220, 230, 240 and 250 are light emitting diodes, such as colorful light emitting diodes. The light-emitting components 220, 230, 240 and 250 are disposed on the bottom surface, the front surface or the center of the main body 110. Then, colorful light is generated according to the requirement of users, which is not limited herein.

Figure 3:
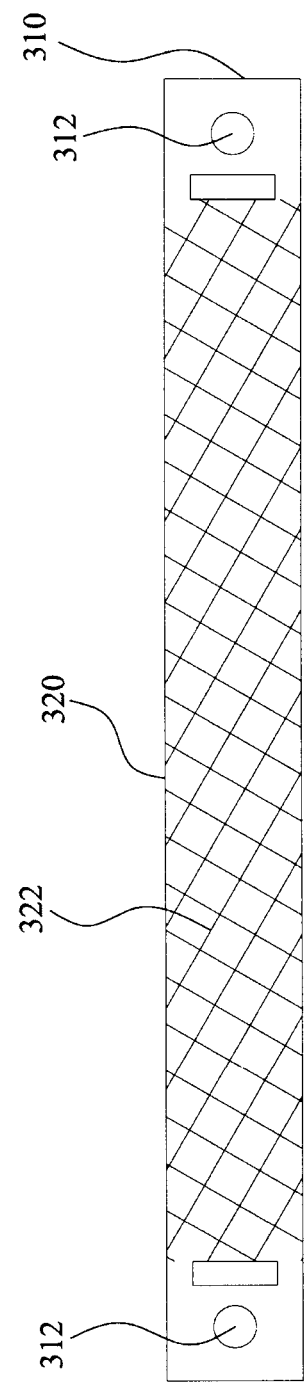
FIG. 3 is a schematic diagram showing an auxiliary device of a motherboard in an embodiment.

Please refer to FIG. 3. In an embodiment, the auxiliary device is a light guiding device 310. The combining component 312 is disposed on the two sides of the light guiding device 310, respectively. A light guiding portion 320 is formed in the center of the light guiding device 310. A light guiding pattern 322 is formed on the light guiding portion 320. As shown in FIG. 3, the light guiding pattern 322 includes a plaid pattern.

In an embodiment, the light guiding pattern 322 includes words patterns or symbols patterns. When a colorful light is generated by the light-emitting component, the color of the light guiding portion 320 changes, and the light guiding pattern 322 of the light guiding device 310 also changes. As a result, the color and the appearance of the computer motherboard are diverse. In an embodiment, the color and the pattern around the motherboard are changed according to the requirement of a program. As a result, the use value of the motherboard is increased.

Figure 4:
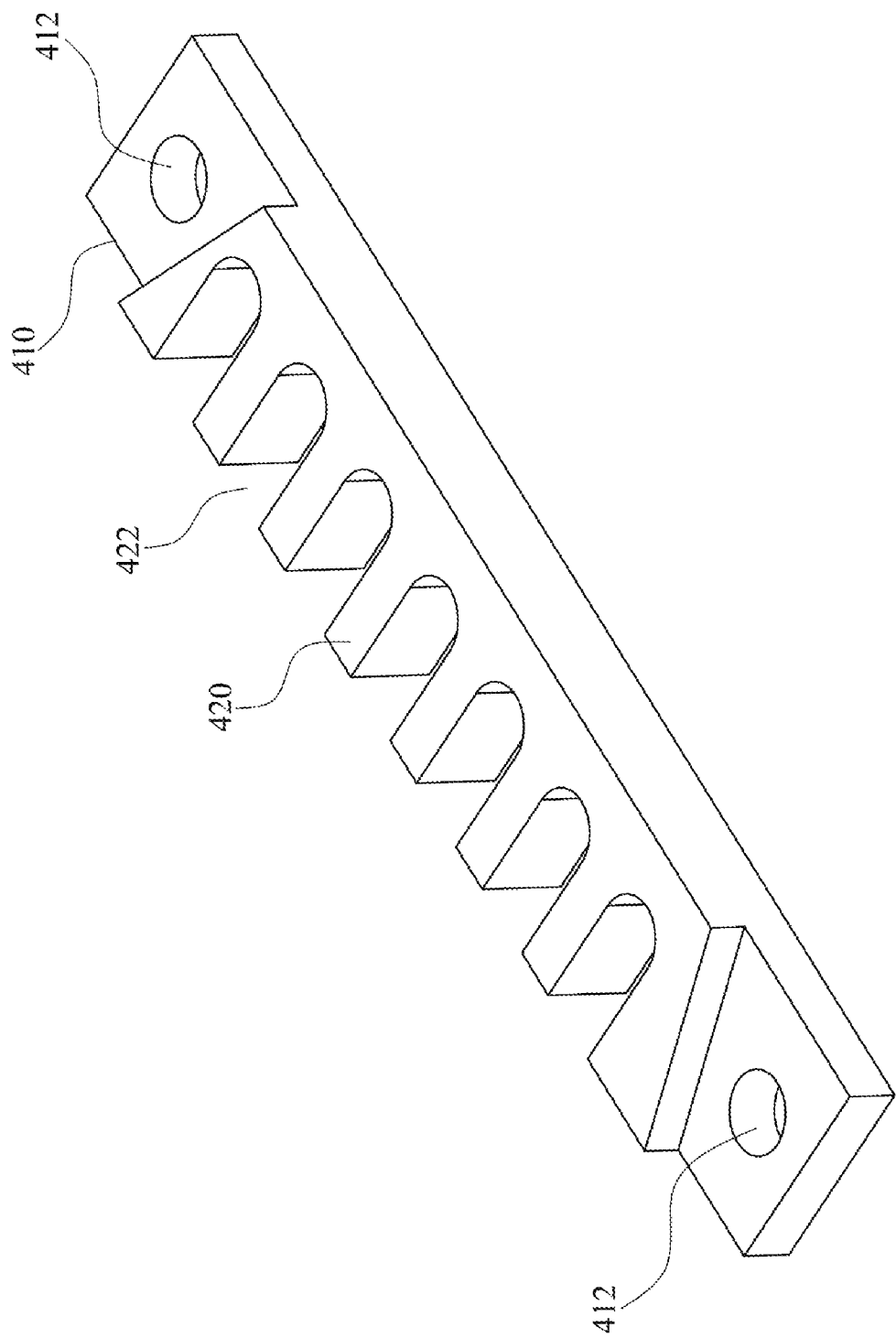
FIG. 4 is a schematic diagram showing an auxiliary device of a motherboard in an embodiment.

Please refer to FIG. 4. In an embodiment, the auxiliary device is a clamping device 410. The clamping device 410 includes two combining components 412 at two ends and a clamping part 420 in the center. A plurality of clamping openings 422 are formed in the clamping part 420. The electric wire is clamped in the clamping opening 422. In an embodiment, electric wires, such as a universal serial bus (USB) wire, is clamped in the clamping opening 422 and extended to another side of the main body 110. The wire is fixed in the notch of the main body conveniently and steadily.

Figure 5A:
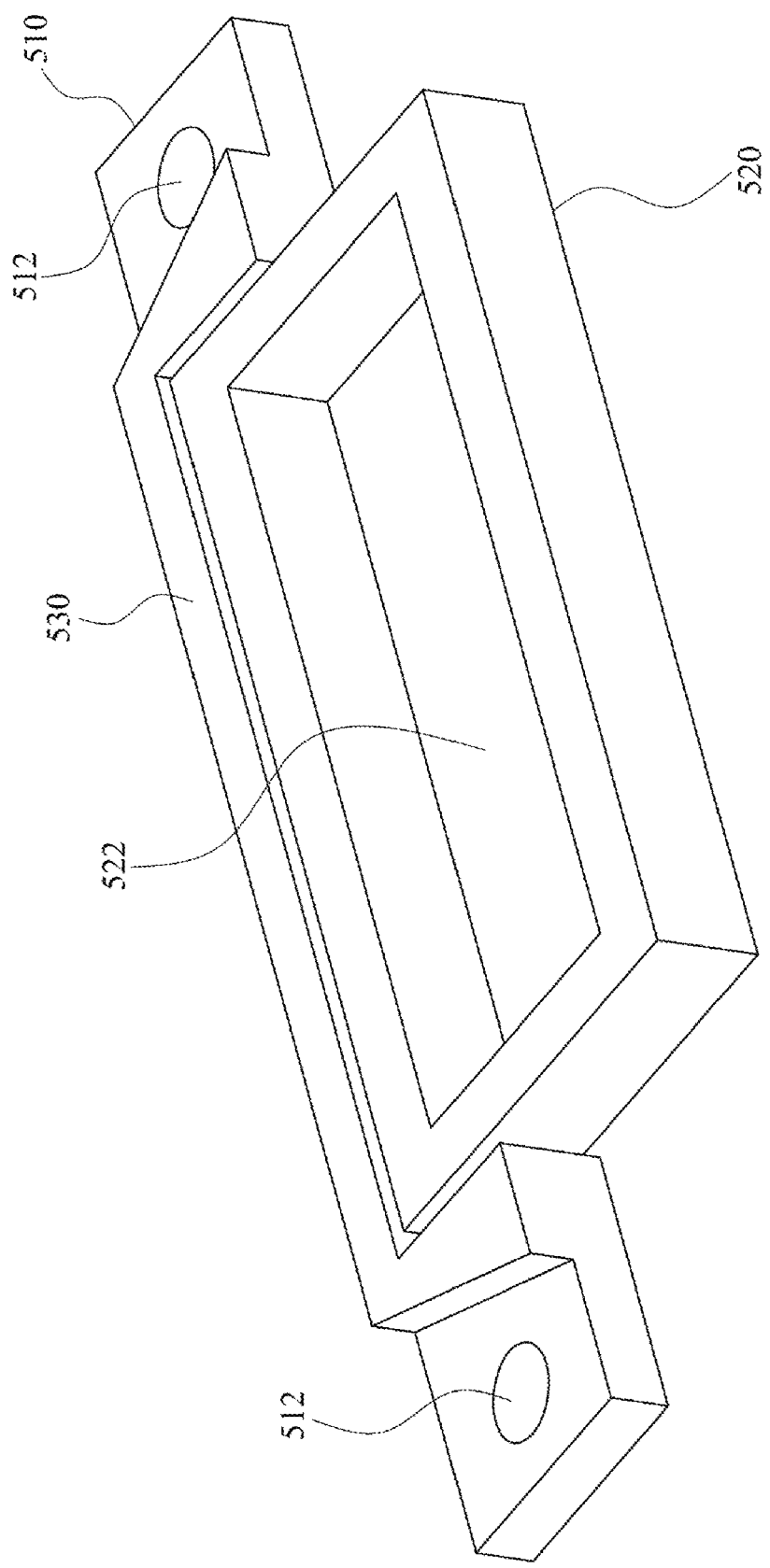
FIG. 5A and FIG. 5B are schematic diagrams showing an auxiliary device of a motherboard in an embodiment.
Figure 5B:
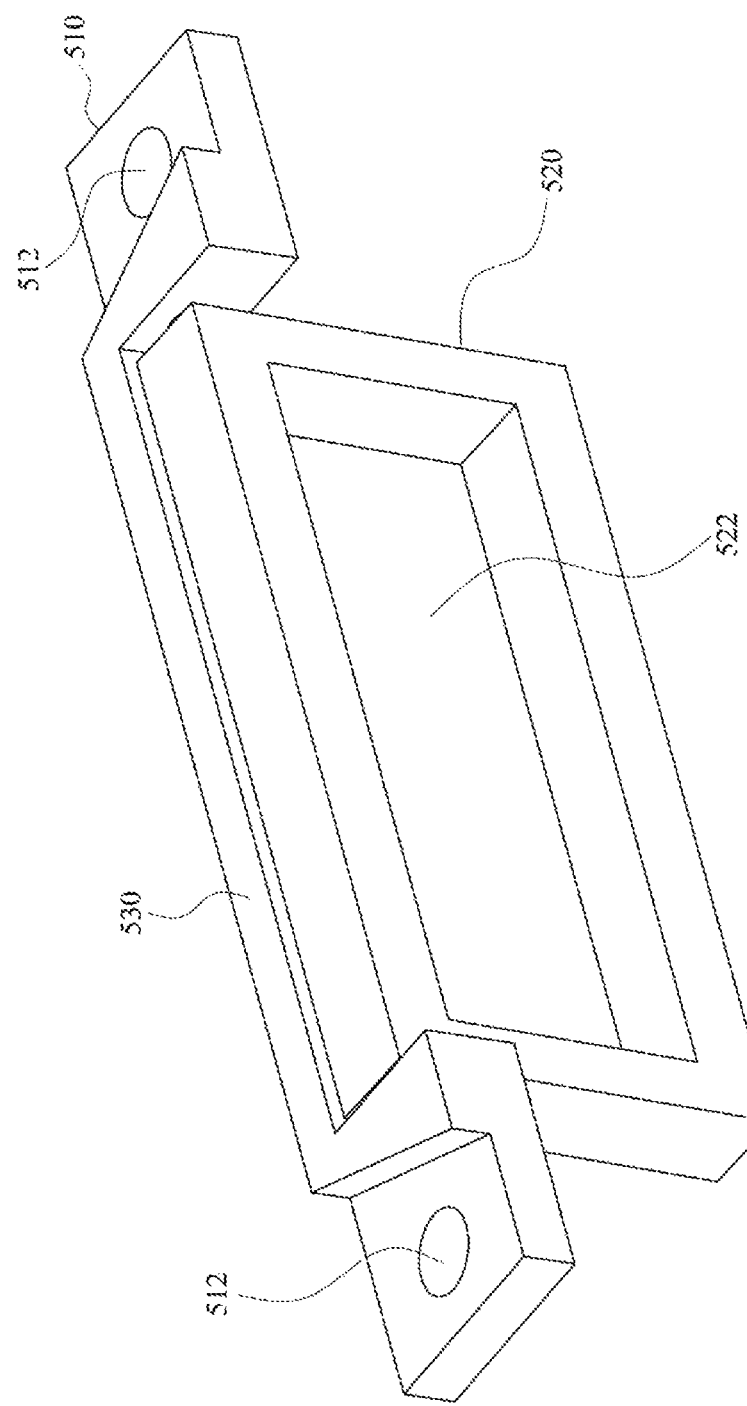

Please refer to FIG. 5A and FIG. 5B. In an embodiment, the auxiliary device is a supporting device 510. The supporting device 510 includes a fixing portion 530 and a supporting component 520. The supporting component 520 is pivotally connected to the fixing portion 530 to rotate relative to the fixing portion 530. Two combining components 512 are formed on the fixing portion 530. An opening 522 is formed in the center of the supporting component 520. In an embodiment, the supporting component 520 is used as a supporting leg when the supporting component 520 is rotated downwardly. Then, the main body 110 is supported by the supporting leg and stands on the desk conveniently while the opening 522 is held. As a result, the motherboard is portable.

The motherboard includes a notch. The auxiliary device is installed in the notch effectively, and the airflow is guided to other surfaces of the motherboard. The aesthetic perception of the circuit board is improved via the light-emitting component and the guiding device. A default pattern is displayed simultaneously. In embodiments, the light-emitting component is disposed under or above the main body, or in the center of the circuit board. Consequently, colorful light is provided according to requirements. The circuit board has an attractive appearance.

Moreover, the operation status of the motherboard is monitored conveniently via the motherboard with the detecting unit. Light is changed to remind users when the motherboard is abnormal. Consequently, the motherboard is safer. Furthermore, the function of the notch can be expanded. For example, when the auxiliary device installed in the notch, a supporting device is formed to support the motherboard. Auxiliary devices, such as a light guiding component, can be designed according to the individual demands by using the 3D printing technology. The auxiliary devices are easily installed around the motherboard. As a result, the function of the motherboard is expanded significantly.

Although the invention has been disclosed with reference to certain embodiments thereof, the disclosure is not for limiting the scope. Persons having ordinary skill in the art may make various modifications and changes without departing from the scope of the invention. Therefore, the scope of the appended claims should not be limited to the description of the embodiments described above.

What is claimed is:

1. A motherboard of a computer, comprising,
   a main body having a first surface, a second surface opposing the first surface, and a side edge interconnecting the first surface and the second surface along an outer perimeter of the main body;
   a notch defined by an indentation of the side edge of the main body as viewed in plan view;
   an auxiliary device, configured as a light guiding device, exhibiting a length longer than a length of the notch; and
   a fixing device, formed adjacent to the notch, configured to fix the auxiliary device in position relative to the notch, wherein, when affixed to the main body by the fixing device, the auxiliary device extends outwardly from the outer perimeter and into a void provided by the notch such that at least a portion of the light guiding device is unobstructed from view in plan view of the first surface and unobstructed from view in plan view of the second surface.

2. The motherboard of the computer according to claim 1, further comprises a lighting device disposed on the first surface of the main body and configured to illuminate the auxiliary device.

3. The motherboard of the computer according to claim 2, wherein the motherboard further includes a detecting unit, the detecting unit detects operation status of the motherboard and provides a detecting result to make the light-emitting component to adjust light conditions according to the detecting result.

4. The motherboard of the computer according to claim 1, wherein the auxiliary device includes a clamping device.

5. The motherboard of the computer according to claim 1, wherein the auxiliary device includes a supporting device.

6. The motherboard of the computer according to claim 5, wherein the supporting device includes a fixing portion and a supporting component, and the supporting component is pivotally connected to the fixing portion to rotate relative to the fixing portion.

7. The motherboard of the computer according to claim 1, wherein the auxiliary device has a visible pattern disposed on the portion that is unobstructed from view.

8. The motherboard of the computer according to claim 1, wherein the notch is elongated along a direction of the side wall.

9. The motherboard of the computer according to claim 1, wherein the auxiliary device spans across the notch.

* * * * *